United States Patent
Dietz et al.

(10) Patent No.: US 7,755,358 B2
(45) Date of Patent: Jul. 13, 2010

(54) METHOD TO DETERMINE THE DESIGN OF A BASIC MAGNET OF A MAGNETIC RESONANCE APPARATUS WITH AT LEAST ONE GRADIENT COIL SYSTEM

(75) Inventors: Peter Dietz, Furth (DE); Graham Hutton, Oxford (GB); Andreas Krug, Furth (DE); Axel Vom Endt, Erimgen (DE)

(73) Assignee: Siemens Aktiengesellschaft, Munich (DE)

(*) Notice: Subject to any disclaimer, the term of this patent is extended or adjusted under 35 U.S.C. 154(b) by 181 days.

(21) Appl. No.: 12/127,885

(22) Filed: May 28, 2008

(65) Prior Publication Data
US 2009/0295519 A1   Dec. 3, 2009

(30) Foreign Application Priority Data
May 30, 2007   (DE) .................. 10 2007 025 096

(51) Int. Cl.
*G01V 3/00*   (2006.01)
(52) U.S. Cl. ...................................... 324/319; 324/320
(58) Field of Classification Search .......... 324/300–322; 600/407–445; 209/597, 604; 364/130
See application file for complete search history.

(56) References Cited

U.S. PATENT DOCUMENTS

| 6,329,139 B1* | 12/2001 | Nova et al. ..................... 506/30 |
| 6,437,568 B1* | 8/2002 | Edelstein et al. ............ 324/318 |
| 6,538,439 B1* | 3/2003 | Ham .......................... 324/318 |
| 7,403,003 B2* | 7/2008 | Kimmlingen et al. ....... 324/307 |
| 2007/0069730 A1 | 3/2007 | Kimmlingen et al. |
| 2008/0315878 A1* | 12/2008 | Ham .......................... 324/318 |
| 2009/0128150 A1* | 5/2009 | Ham et al. .................. 324/318 |
| 2009/0209842 A1* | 8/2009 | Koevoets et al. ............ 600/410 |

* cited by examiner

*Primary Examiner*—Brij B Shrivastav
(74) *Attorney, Agent, or Firm*—Schiff Hardin LLP

(57) ABSTRACT

The method for determination of the design of the basic magnet of a magnetic resonance apparatus with at least one gradient coil system, the design of the basic magnet is determined by taking into consideration forces acting on the at least one gradient coil system that may lead to vibrations of the gradient coil system due to switching processes of the gradient coil system in the field of the basic magnet.

17 Claims, 4 Drawing Sheets

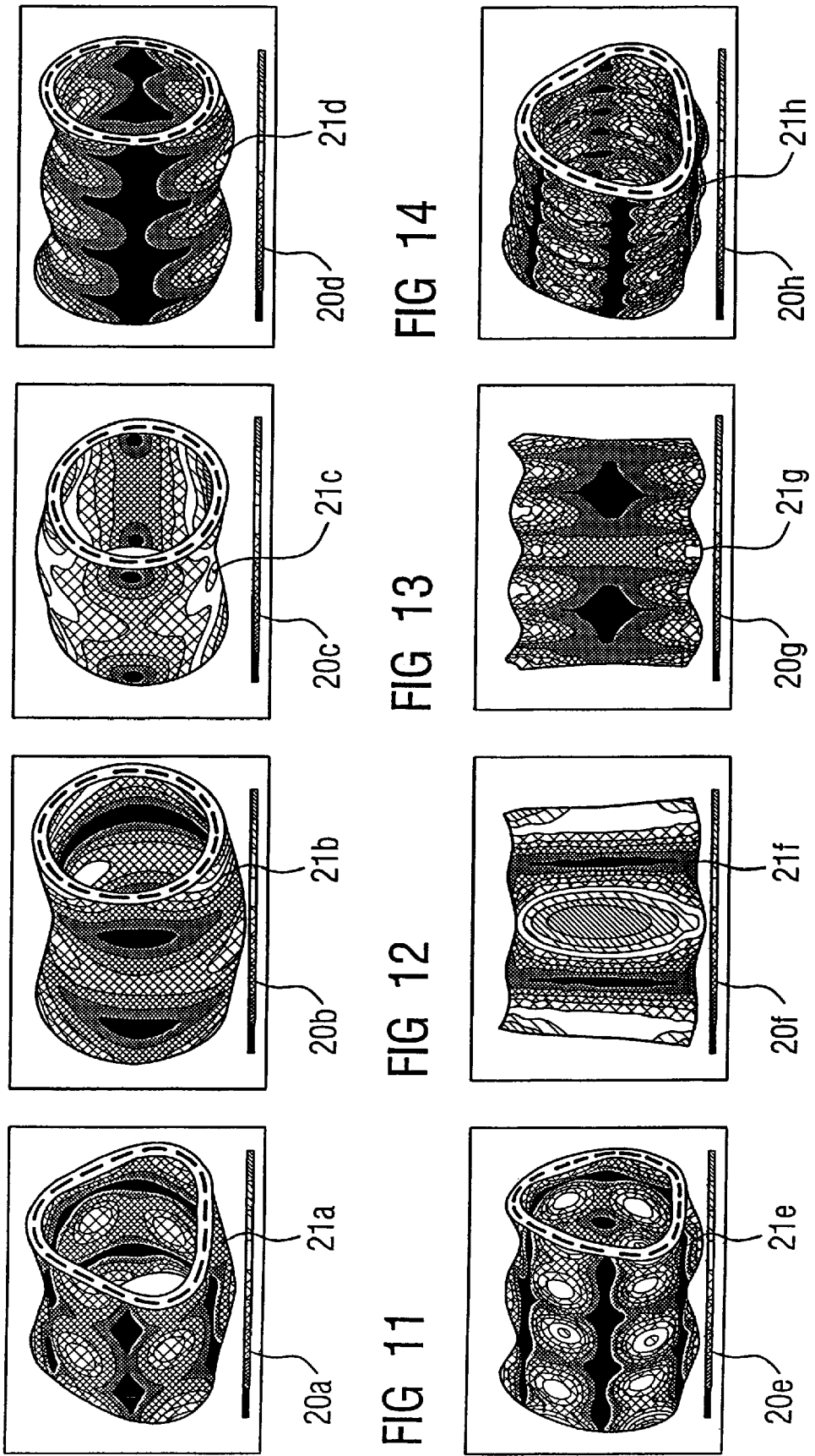

METHOD TO DETERMINE THE DESIGN OF A BASIC MAGNET OF A MAGNETIC RESONANCE APPARATUS WITH AT LEAST ONE GRADIENT COIL SYSTEM

BACKGROUND OF THE INVENTION

1. Field of the Invention

The present invention concerns a method to determine the design of a basic magnet of a magnetic resonance apparatus with at least one gradient coil system.

2. Description of the Prior Art

In magnetic resonance apparatuses that serve to generate image exposures of structures inside the body, a system of gradient magnetic fields is superimposed on the basic magnetic field for spatial coding of the image information. For this purpose, high currents are applied and removed again within the shortest possible time in the gradient coils serving for field generation. The conductors of the gradient coils are subjected to strong forces due to this rapid switching of the gradient coils in the strong magnetic field of the basic magnet.

The Lorentz forces that act on electrical charges in electromagnetic fields additively combine to produce large net forces. The forces accordingly acting on the gradient coil generate oscillations of the gradient coil system. These oscillations can cause noise as well as image artifacts and eddy current losses in the structure of the magnet or the cryostat fashioned with superconducting coils, with the result of a vaporization of the helium serving for low-temperature generation.

Therefore, in the design of the gradient coil system attempts have been made to take into account, as an additional consideration the minimization, of the net force that acts on this system when the gradient coils are located in volume in which the basic magnetic field is present. This additional limitation or mandatory condition leads to compromises in the specifications that are important, or possible, for the gradient coil system. For example, compromises must be made in the linearity, the rise time, the gradient amplitude and the scatter field.

SUMMARY OF THE INVENTION

An object of the present invention is to provide a design method that is improved in this regard.

This object is achieved in accordance with the invention by a method of the aforementioned type wherein the design of the basic magnet is determined while taking into account forces acting on the at least one gradient coil system that may lead to vibrations of the gradient coil system due to switching processes of the gradient coil system in the field of the basic magnet.

For the design it is consequently (possibly additionally) taken into account that, due to the switching processes of the gradient coil system that is located in the field of the basic magnet, forces act on this gradient coil system.

This means that, with the method according to the invention, the basic magnet of a magnetic resonance apparatus is designed from the outset such that the forces acting on the gradient coil system in the switching processes of the gradient coil system due to the existing strong basic magnetic field are taken into account. By including the forces and oscillations of the gradient coils of the gradient coil system caused thereby in the magnet design of the basic field magnet, it is possible to effectively minimize the noise as well as image artifacts and eddy current losses that arise due to the vibrations or oscillations.

It is thus not necessary, as with conventional designs, to enter into the aforementioned compromises with regard to the acting forces in the specification of the gradient coils; rather, the oscillation generation (for example with regard to resonant modes that are excited by the basic magnetic field) is already taken into account in the design of the basic magnet, such that overall a more advantageous design for the entire system of the magnetic resonance apparatus with the basic magnet and the gradient coils can be selected. The resonant modes or the forces on the gradient coil structure that arise due to the switching processes are thus actively addressed. The design of the basic magnet, thus the design of the arrangement of the winding packages (winding groups) is thus optimized such that the forces on the gradient coil system are not too large. The desired specification with regard to the overall magnetic resonance system therefore can be better achieved.

The forces acting on the gradient coil system or systems can be taken into account by determination of vibration modes of the or at least one gradient coil system. Known magnetic resonance apparatuses have gradient coil systems in the x-, y- and z-directions. For an optimal magnet design it is reasonable to take into account all forces acting on these systems, but an optimization for a specific sub-system may be sufficient. The consideration of the acting forces then occurs by calculation of the vibration modes for the gradient coil system or the multiple gradient coil systems. This is implemented by solving the oscillation equations that can be formulated for the coils are solved for the mechanical system of the gradient coil.

According to the invention the vibration modes are appropriately determined as linear combinations of the mechanical eigenmodes of at least one gradient coil system. A simulation of multiples of the eigenmodes of the one or, respectively, multiple or all gradient coil systems is thus formulated in order to express the vibration modes.

The eigenmodes and possibly the associated eigenfrequencies are determined by conducting a mode analysis for the at least one gradient coil system. This means that a set of equations of the form $$M \cdot \ddot{u} + K \cdot u + D \cdot \dot{u} = 0$$

is solved.

In this oscillation equation M is the mass matrix, K is the rigidity matrix and D is the attenuation matrix. The deflection amplitudes are described by u. The preceding equations have solutions of the form $$u(x,t) = \exp(i\omega t) \cdot \phi(x)$$

with the eigenmodes $\phi(x)$ and the eigenfrequencies $\omega$; x indicates the location, t the time.

The mode analysis is appropriately conducted using at least one finite element method. In finite element methods the calculation region is sub-divided into a large number of smaller but finite regions. Initial functions are defined for these regions, wherein an equation system is obtained by partial differential equations under consideration of the boundary conditions. Ultimately the desired results are obtained from this equation system.

The mode analysis can thereby be implemented using one or multiple numerical finite element packages. Under the circumstances, already-existing finite element method packages (FEM packages) can thereby be resorted to. An example of such a software is the commercially distributed software ANSYS (short for "Analysis System").

The distribution of the Lorentz forces is appropriately determined in the framework of the consideration of the acting forces. The relevance of the specific eigenmodes for the oscillation movement of the gradient coils results from this. The distribution follows from the design of the gradient coils as well as the magnetic field of the basic magnet at the positions of the conductors of the gradient coils.

The distribution of the Lorentz forces is advantageously determined using participation factors. These modal participation factors then indicate how strongly a specific eigenmode is deflected.

The participation factors are advantageously determined in that the Lorentz forces are presented in a base of mechanical eigenmodes of at least one gradient coil system, wherein the participation factors result as Fourier coefficients.

The Lorentz force (which can be written as a vector in discrete form that describes the force at every single mass point) is thus expressed in the base of the mentioned eigenmodes $\phi(x)$. The Fourier coefficients of this series are the participation factors $P_i$ of the Lorentz force with regard to the i-th eigenmode, meaning that $$P_i = \phi_i \cdot F$$

applies.

The normalization factor was set to 1.

For transverse coils the vibration spectrum is determined via modes with an odd number of antinodes in the longitudinal direction. For asymmetrical coils, additional oscillation modes must be taken into account. This means that in this case only these participation factors that are to be associated with the cited modes have non-vanishing values.

Because $$F = I \times B,$$

the Lorentz force is a linear function of the magnetic field B and the participation factors $P_i$ are a linear function of the magnetic field B.

The acting forces and/or participation factors are appropriately predetermined as conditions in the framework of an optimization method. The functions $F(J)$ and $\phi_i(J)$ are thus specified as additional (linear) conditions for the optimization of the magnet. As already noted, the participation factors $P_i$ result from the eigenmodes $\phi_i$ and the forces as $$P_i = \phi_i \cdot F.$$

Furthermore, the current density distribution of the basic magnet can be determined in the framework of an optimization method taking into account at least one parameter for the design of the basic magnet, in particular taking into account the homogeneity and/or the capacity as a superconductor and/or the mechanical tension and/or the rigid body forces. The current density distribution is thus advantageously determined as a result of a multi-objective optimization method. A number of design parameters (possibly all of the aforementioned or addition design parameters) are thus balanced among one another in order to obtain an optimal design for the basic magnet.

Moreover, it is particularly advantageous when forces acting on the at least one gradient coil system and possibly leading to vibrations of the gradient coil system are taken into account in the design of at least one gradient coil system of the magnetic resonance apparatus due to switching processes of the gradient coil system in the field of the basic magnet. Not only is the design of the basic magnet suitably developed to minimize the Lorentz forces on the gradient coil system or the multiple gradient coil systems, but also the gradient coils are optimized in this regard, for example with regard to the position of their conductors. In this case a design of the gradient coil system and of the basic magnet can ensue simultaneously or, respectively, in parallel, which design is developed such that an optimal fulfillment of the desired specification is possible with the combination of the design of the gradient coil system and the design of the basic field magnet. Both system components are thus optimally combined. An optimal design is therefore achieved for the overall system via the mutual consideration of the respective requirements to be placed on the gradient coil system and the basic magnet.

Due to the consideration of the forces on the gradient coil and the vibrations of the gradient coil, the noise, image artifacts and eddy current losses hereby induced can already be effectively minimized in the design of the basic magnet. A combined optimization of the magnet and the gradient coil is in particular achieved given an additional consideration of the acting forces in the design of the gradient coil system itself, whereby a global optimum of the system can be assumed. The entire system is therefore optimized, in contrast to approaches for optimization of a sub-system as is the case in the known approaches that merely pertain to the gradient coil system.

The inventive method thus initially seeks to optimize the design of the basic magnet so that optimally slight forces act on the gradient coil system given a stationary design of a gradient coil system. It is also the object of the invention to specify a reciprocal optimization of the gradient coil system and of the basic magnet (or the coils of the basic magnet) with regard to achieving an optimal overall system for the acquisition of magnetic resonance exposures.

BRIEF DESCRIPTION OF THE DRAWINGS

FIGS. 7-14 show respective eigenmodes of a transverse gradient coil for consideration in a method according to the invention.

DESCRIPTION OF THE PREFERRED EMBODIMENTS

Figure 1:
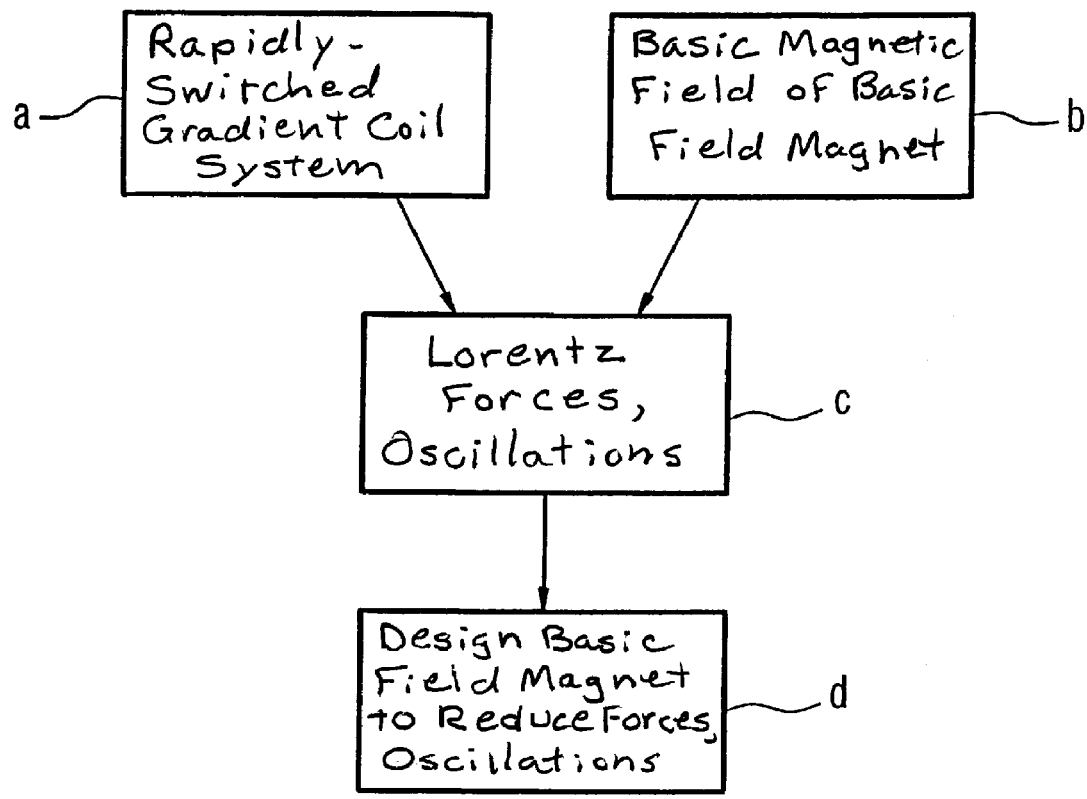
FIG. 1 shows the basic steps for design determination of a basic field magnet of a magnetic resonance system in a method according to the invention.

The basic steps for design determination of a basic field magnet of a magnetic resonance system in a method according to the invention are shown in FIG. 1. The basic design concerns a method in which both the design of the basic magnet and the design of the gradient coil system are determined.

Block a symbolizes that the gradient coil system of a magnetic resonance apparatus is subjected to fast switching processes.

Block b indicates that the gradient coil system with the fast switching processes according to block a is located in a strong magnetic field of a basic field magnet. Lorentz forces that act on the gradient coil system and excite this to oscillations thereby result, as indicated by the block c. These Lorentz forces or, respectively, oscillations according to block c are now taken into account for the design of the basic magnet in the method according to the invention, as is indicated by the block d. Furthermore, they are considered as well in the design of the gradient coil system or of the gradient coil systems in the variants of the inventive method described here.

An optimal overall design for the magnetic resonance apparatus with the basic magnet and the gradient coil system is therefore achieved in the framework of an optimization process.

In accordance with the invention, starting from a determined basic magnetic field (generated in previous magnets, for example) and a determined gradient coil arrangement, a step-by-step (iterative) optimization is implemented that leads from an initial design to an optimal end design of the basic magnet and of the gradient coil system.

Other types of optimization methods can also be used in other realizations of the method.

Figure 2:
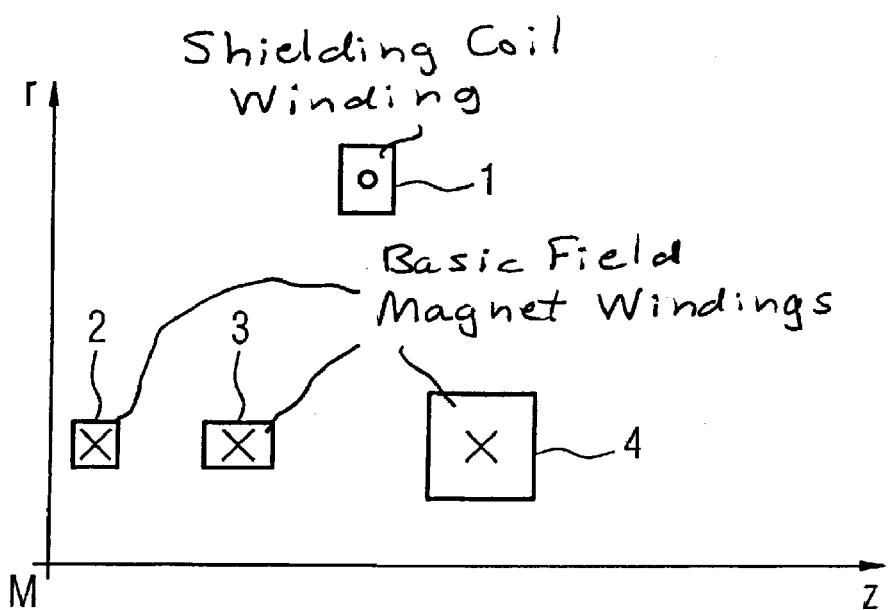
FIG. 2 schematically illustrates a possible arrangement of windings of a basic magnet of a magnetic resonance apparatus.

An example of an arrangement of windings in a basic magnet of a magnetic resonance apparatus is shown in FIG. 2. The abscissa represents the z-direction (thus the longitudinal direction) of the magnetic resonance tomography apparatus. The radius r (thus the transverse direction of the magnetic resonance tomography apparatus) is plotted on the ordinate. The intersection point of the two axes indicates the middle M of the coil system. The entire magnetic resonance tomography apparatus thus has a system of windings that is to be supplemented to the left as well as downward analogous to the windings shown in FIG. 2.

FIG. 2 shows the winding 1 of the shielding coil and the windings 2, 3 and 4 of the basic field magnet coil. The magnetic field that acts at the point of the windings of the gradient coil system (which is not shown here) exhibits maxima at each of the positions of the winding packets or windings 2, 3 and 4 of the basic magnet.

Figure 3:
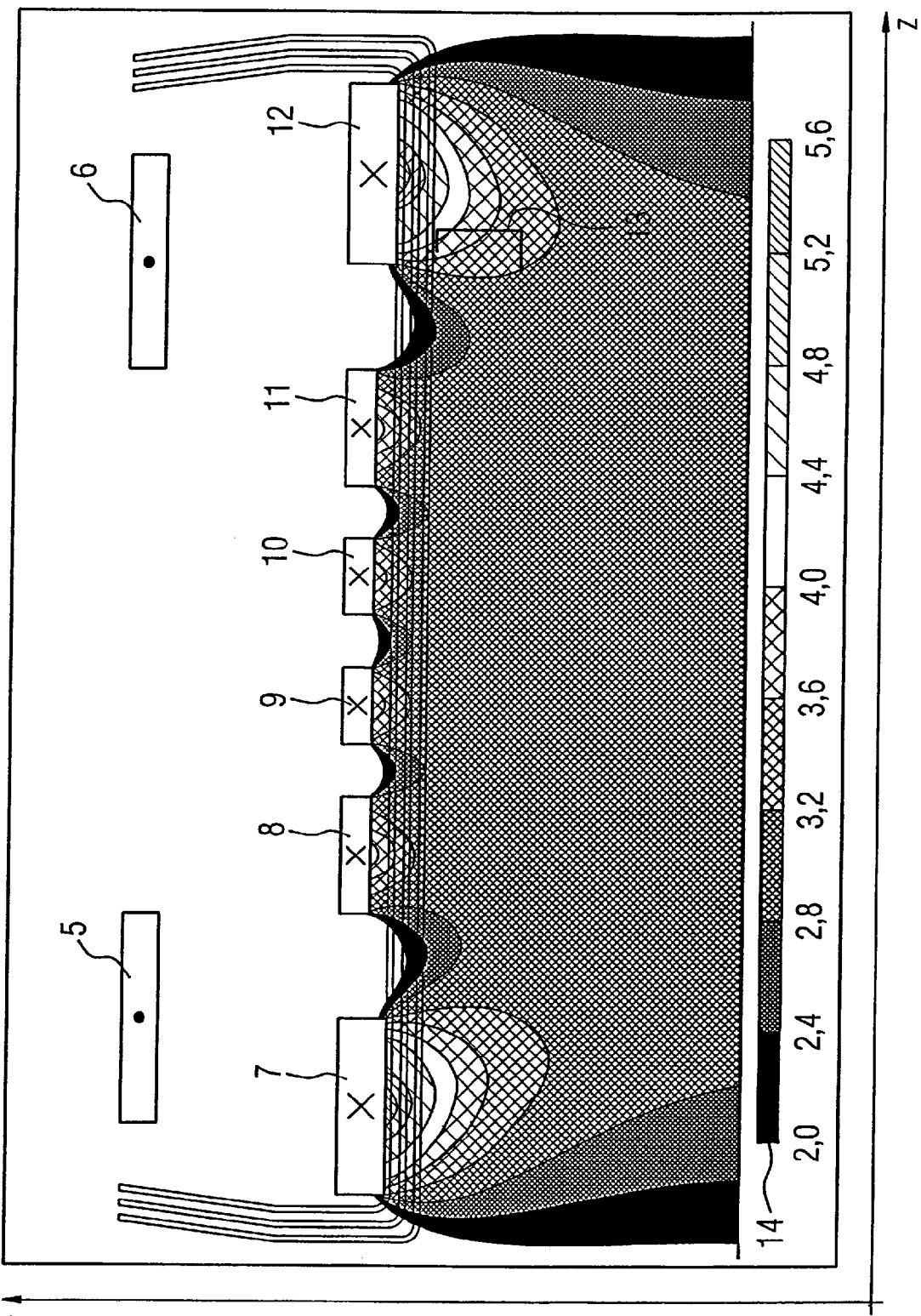
FIG. 3 is a representation of the strength of a magnetic field of a basic magnet of a magnetic resonance device.

The strength of the magnetic field of a basic magnet of a magnetic resonance apparatus is shown in FIG. 3. The windings of a shielding coil that are designated 5, 6 are shown again only for the upper portion of the magnetic resonance apparatus. Moreover, windings 7-12 of the basic magnet are shown. The abscissa indicates the z-direction, the ordinate the radial direction relative to radius R. Furthermore, the arrangement or the position of the gradient coil is indicated by the reference character 13 in the representation. The bars 14 respectively indicate the strength of the magnetic field in Tesla.

From FIG. 3 it can be seen that the magnetic field of the basic magnet acts at the location of the gradient coil such that the maxima of the magnetic field respectively have effects in the region of the windings 7-12, also in the region of the arrangement or support of the conductors of the gradient coil according to the reference character 13. Given rapid switching processes of the gradient coil system in the strong magnetic field of the basic magnet, forces are exerted on the gradient coil that can set this coil into oscillation. In accordance with the invention, these forces are taken into account for optimization of the design of the basic magnet in the calculation for determination.

Figure 4:
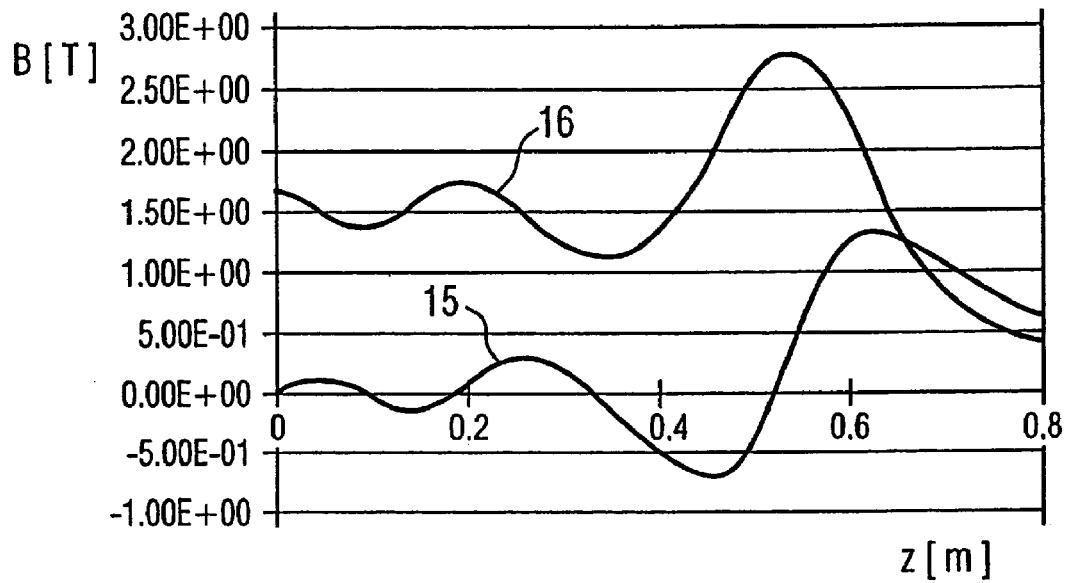
FIG. 4 is a representation of the strength of the magnetic field at a secondary gradient coil level.

FIG. 4 shows a representation of the strength of the magnetic field at a secondary gradient coil level of a magnetic resonance apparatus. The longitudinal direction z of the magnetic resonance tomograph is thereby plotted on the abscissa. The magnetic field B in Tesla T is plotted on the ordinate.

The curve 15 shows the magnetic field Br, thus the radial curve or the radial magnetic field component. The curve 16 represents the longitudinal component $B_z$. z=0 thereby indicates the position of the coil middle, z=0.8 the position of the coil end.

In the course of the curves 15 off 16 it can be seen that these have a series of maxima and minima that are correspondingly connected with higher or lower forces on the gradient coil system given switching processes of said gradient coil system. In the presented case the magnetic field acting in the region of the secondary (transverse) gradient coil level is up to three Tesla in strength, thus possesses a considerable strength. Correspondingly large forces act on the gradient coil.

Figure 5:
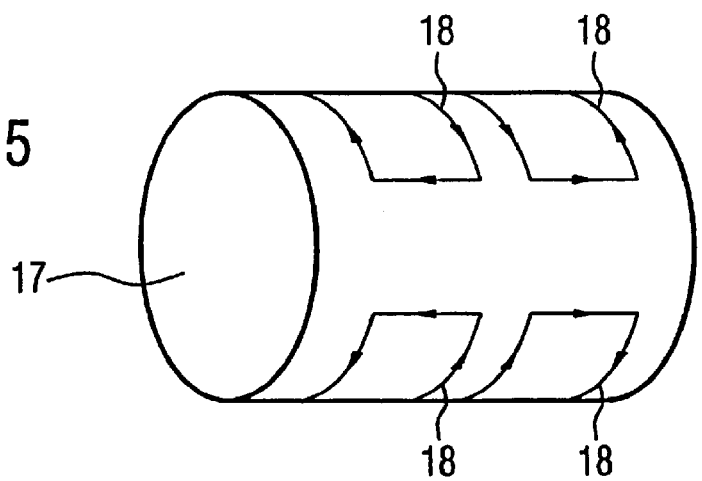
FIGS. 5 and 6 respectively show a typical current path as well as the resulting force on a gradient coil in the field of a basic magnet.
Figure 6:
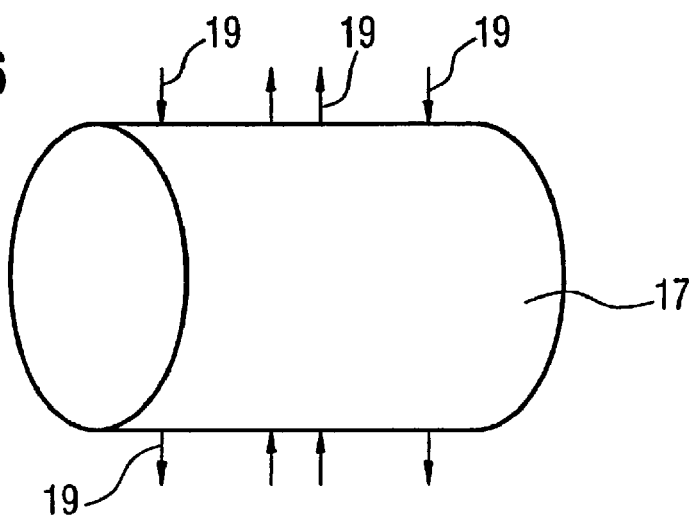

A typical current path is shown in FIG. 5 and the resulting force on a gradient coil 17 in the field of a basic magnet is shown in FIG. 6.

The current course is indicated by the arrows 18 in FIG. 5. The representations are for a transverse coil.

Forces acting on the gradient coil 17 (which forces are indicated by the arrows 19 in FIG. 6) arise in the field of the basic magnet from the current course as it is symbolized by the arrows 18 in FIG. 5. A force acts upwardly in the center of the gradient coil 17 while a force acts downwardly in the end regions. These forces are Lorentz forces that result as a cross product of the speed of the respective electrical charge and the acting magnetic field. For example, for the acting forces according to the arrows 19 the current courses are thus respectively in the middle and at the end of the gradient coil 17. Oscillation modes for the gradient coil 17 can be associated with these forces in that the Lorentz force is shown in the base of the eigenmodes. The Fourier coefficients of such a series then indicate the participation factors of the Lorentz force with regard to the respective eigenmode. For a transverse gradient coil 17 the vibration spectrum is dominated by modes with an odd number of antinodes.

Corresponding eigenmodes $21a$-$21h$ of a transverse gradient coil with values according to the bars $20a$-$20h$ are shown in FIG. 7-14 for consideration in an inventive method for determination of the design of a basic magnet and possibly the design of a gradient coil system as well.

According to the bars $20a$-$20h$, the respective value for the eigenmodes $21a$-$21h$ according to FIG. 7-14 rises along the bars $20a$-$20h$ from left to right. FIG. 7-14 thus represent different solutions for the eigenmodes $21a$-$21h$, $\phi(x)$ that result from the equations $$M \cdot \ddot{u} + K \cdot u + D \cdot \dot{u} = 0,$$

wherein M designates the mass matrix, K designates the rigidity matrix and D designates the attenuation matrix while u are the deflection amplitudes. The respective solutions are obtained in the form $$u(x,t) = \exp(i\omega t) \cdot \phi(x),$$

from which the eigenmodes $21a$-$21h$, $\phi(x)$ result. The consideration of the eigenmodes $21a$-$21h$ and possible further modes of the gradient coil enables the design of the basic magnet and (if desired) also of the gradient coil to be effected or, adapted such that the acting forces that can lead to oscillations of the gradient coil are optimally small. The occurrence of noise, image artifacts and eddy current losses in the overall system is reduced.

A reduction of noise, image artifacts and exposure losses can also already be achieved with a method in which the forces and oscillations according to the eigenmodes $21a$-$21h$ of FIG. 7-14 are used merely for the design of the basic field magnet in the case of a stationary gradient coil design.

In summary, according to the invention an optimal magnet design and possibly also a gradient coil design can be achieved via additional consideration of the forces acting on the gradient coils. The resonant modes of the gradient coil structure that arise due to the forces in the magnetic field are actively included in the design.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method for determining a design of a basic magnet of a magnetic resonance apparatus having at least one gradient coil system, comprising the steps of:
   designing a basic magnet of a magnetic resonance apparatus dependent on forces acting on at least one gradient coil system of the magnetic resonance apparatus that may cause vibrations of the gradient coil system due to current switching of the gradient coil system in a volume encompassed by a magnetic field generated by the basic magnet; and
   automatically electronically implementing said design of said basic magnet to minimize said vibrations.

2. A method as claimed in claim 1 comprising identifying said forces by determining vibration modes of said at least one gradient coil system.

3. A method as claimed in claim 2 comprising determining said vibration modes as linear combinations of respective mechanical eigenmodes of said at least one gradient coil system.

4. A method as claimed in claim 3 comprising determining said eigenmodes by implementing a computerized mode analysis for said at least one gradient coil system.

5. A method as claimed in claim 4 comprising, in said mode analysis, also identifying eigenfrequencies respectively associated with the eigenmodes.

6. A method as claimed in claim 4 comprising implementing said mode analysis using at least one finite element method.

7. A method as claimed in claim 1 comprising determining said forces by identifying a distribution of Lorentz forces that occur in said magnetic resonance apparatus due to said current switching.

8. A method as claimed in claim 7 comprising determining said distribution of Lorentz forces using participation factors.

9. A method as claimed in claim 8 comprising determining said participation factors by representing said Lorentz forces as a base of respective mechanical eigenmodes of said at least one gradient coil system, and determining said participation factors as Fourier coefficients of said mechanical eigenmodes.

10. A method as claimed in claim 8 comprising determining said participation factors as said linear functions of a current density distribution of said basic magnet.

11. A method as claimed in claim 10 comprising determining said participation factors as said linear functions of said current density distribution in an optimization method for minimizing said vibrations.

12. A method as claimed in claim 1 comprising determining said forces as said linear functions of a current density distribution of said basic magnet.

13. A method as claimed in claim 12 comprising determining said forces as said linear functions of said current density distribution in an optimization method for minimizing said vibrations.

14. A method as claimed in claim 1 comprising designing said basic magnet to minimize said vibrations by implementing an optimization method including determining a current density distribution of the basic magnet to generate at least one parameter in said optimization method.

15. A method as claimed in claim 14 comprising selecting said at least one parameter from the group consisting of homogeneity of said field generated by said basic magnet, mechanical tension in said magnetic resonance apparatus, and rigid body forces in said magnetic resonance apparatus.

16. A method as claimed in claim 14 wherein said basic magnet is a superconducting magnet and comprising employing superconducting capacity as said at least one parameter.

17. A method as claimed in claim 1 comprising minimizing said vibrations by also designing said at least one gradient coil system, dependent on said forces, to at least minimize said vibrations.

* * * * *